United States Patent
Rowley

(10) Patent No.: US 10,775,424 B2
(45) Date of Patent: Sep. 15, 2020

(54) CAPACITIVE VOLTAGE DIVIDER FOR MONITORING MULTIPLE MEMORY COMPONENTS

(71) Applicant: Micron Technology, Inc., Boise, ID (US)

(72) Inventor: Matthew D. Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 16/119,640

(22) Filed: Aug. 31, 2018

(65) Prior Publication Data
US 2020/0072884 A1    Mar. 5, 2020

(51) Int. Cl.
| G06F 1/3225 | (2019.01) |
| G01R 27/26 | (2006.01) |
| G06F 1/3296 | (2019.01) |
| G06F 1/3234 | (2019.01) |

(52) U.S. Cl.
CPC ....... *G01R 27/2605* (2013.01); *G06F 1/3225* (2013.01); *G06F 1/3275* (2013.01); *G06F 1/3296* (2013.01)

(58) Field of Classification Search
CPC .... G06F 1/3225; G06F 1/3296; G06F 1/3275; G01R 27/2605
See application file for complete search history.

(56) References Cited

U.S. PATENT DOCUMENTS

| 1,046,692 | A  | * | 12/1912 | Walker | B65D 9/20 |
| | | | | | 217/12 A |
| 6,577,535 | B2 | * | 6/2003 | Pasternak | G11C 5/14 |
| | | | | | 365/185.11 |
| 7,664,971 | B2 | * | 2/2010 | Oh | G06F 1/3203 |
| | | | | | 713/300 |
| 8,222,881 | B2 | | 7/2012 | Ivanov et al. | |
| 8,442,059 | B1 | * | 5/2013 | de la Iglesia | H04L 67/1097 |
| | | | | | 370/389 |
| 8,542,059 | B2 | | 9/2013 | Tejada et al. | |
| 8,564,313 | B1 | * | 10/2013 | Ryshtun | H03K 17/962 |
| | | | | | 324/678 |

(Continued)

FOREIGN PATENT DOCUMENTS

JP   2016184302 A   10/2016

OTHER PUBLICATIONS

Charge Pump Document, Wikiedia, pp. 1 (Year: NA).*

(Continued)

*Primary Examiner* — Aurel Prifti
(74) *Attorney, Agent, or Firm* — Brooks, Cameron & Huebsch, PLLC

(57) ABSTRACT

A memory sub-system includes a plurality of memory components where at least two of the memory components are configured to operate at different supply voltages. A capacitive voltage divider (CVD) configured to, responsive to a status of use of each of the memory components, select between a plurality of connections of a plurality of capacitors to reduce an input voltage of the memory sub-system. The plurality of connections is configured to provide different voltage magnitudes that correspond to the different supply voltages, and the CVD is further configured to output the different supply voltages to enable the use of each of the memory components.

20 Claims, 6 Drawing Sheets

(56) References Cited

U.S. PATENT DOCUMENTS

| | | | |
|---|---|---|---|
| 8,806,245 B2* | 8/2014 | Machnicki | G06F 1/324 |
| | | | 711/156 |
| 9,484,070 B2* | 11/2016 | Grunzke | G11C 5/147 |
| 9,519,300 B2* | 12/2016 | Mok | G05F 1/46 |
| 9,536,805 B2 | 1/2017 | Fazelpour et al. | |
| 9,666,297 B1* | 5/2017 | Ha | G11C 16/30 |
| 9,753,470 B1 | 9/2017 | Hawley et al. | |
| 9,929,130 B2 | 3/2018 | Kent | |
| 9,973,431 B2 | 5/2018 | Mishra et al. | |
| 10,170,994 B1* | 1/2019 | Gibney | H02M 3/156 |
| 10,205,388 B2* | 2/2019 | Choi | G01R 19/0092 |
| 2006/0174140 A1* | 8/2006 | Harris | G11C 5/04 |
| | | | 713/300 |
| 2008/0203991 A1 | 8/2008 | Williams | |
| 2008/0232174 A1* | 9/2008 | Cornwell | G11C 5/145 |
| | | | 365/189.09 |
| 2009/0172442 A1* | 7/2009 | Alexander | G06F 1/26 |
| | | | 713/323 |
| 2010/0165776 A1 | 7/2010 | Tada | |
| 2010/0171544 A1* | 7/2010 | Seo | G11C 5/145 |
| | | | 327/536 |
| 2010/0244858 A1* | 9/2010 | Cormier, Jr. | G06F 3/044 |
| | | | 324/678 |
| 2010/0332863 A1* | 12/2010 | Johnston | G06F 1/26 |
| | | | 713/300 |
| 2013/0027061 A1* | 1/2013 | Hristov | G06F 3/0416 |
| | | | 324/678 |
| 2013/0088242 A1* | 4/2013 | Lundstrum | H03K 17/9622 |
| | | | 324/609 |
| 2013/0265828 A1* | 10/2013 | Cunningham | G11C 5/145 |
| | | | 365/185.19 |
| 2014/0146608 A1* | 5/2014 | Jung | G11C 16/30 |
| | | | 365/185.11 |
| 2014/0321226 A1* | 10/2014 | Pyeon | G11C 5/145 |
| | | | 365/222 |
| 2015/0198932 A1* | 7/2015 | Cha | H02M 3/156 |
| | | | 700/295 |
| 2016/0011962 A1* | 1/2016 | DeCesaris | G06F 11/3409 |
| | | | 711/154 |
| 2016/0054788 A1* | 2/2016 | Gulati | G06F 1/3287 |
| | | | 713/323 |
| 2017/0017293 A1* | 1/2017 | Muccini | H05K 7/1498 |
| 2017/0062056 A1* | 3/2017 | Park | G11C 16/10 |
| 2017/0097674 A1* | 4/2017 | Tschirhart | G06F 1/206 |
| 2017/0098469 A1* | 4/2017 | Park | G11C 5/145 |
| 2017/0099011 A1 | 4/2017 | Freeman et al. | |
| 2017/0154666 A1* | 6/2017 | Park | G11C 5/145 |
| 2017/0262033 A1* | 9/2017 | Rotbard | G06F 1/263 |
| 2017/0371574 A1* | 12/2017 | Springberg | G06F 3/0625 |
| 2018/0225053 A1* | 8/2018 | Yim | G06F 3/0625 |
| 2018/0232043 A1* | 8/2018 | DiBene, II | G06F 1/263 |
| 2019/0199339 A1* | 6/2019 | Zhou | H03K 17/51 |
| 2019/0318800 A1* | 10/2019 | Hsu | G11C 29/1201 |

OTHER PUBLICATIONS

International Search report and Written Opinion from related international application No. PCT/US2019/047623, dated Dec. 6, 2019, 12 pages.

* cited by examiner

CAPACITIVE VOLTAGE DIVIDER FOR MONITORING MULTIPLE MEMORY COMPONENTS

TECHNICAL FIELD

The present disclosure relates generally to memory sub-systems, and more particularly, to a capacitive voltage divider for monitoring multiple memory components for memory sub-systems.

BACKGROUND

A memory sub-system can be a storage system, such as a solid-state drive (SSD), and can include one or more memory components that store data. The memory components can, for example, include volatile memory components and non-volatile memory components. The memory sub-system can include a controller that can manage the memory components and allocate data to be stored at the memory components. In general, a host system can utilize a memory sub-system to store data at the memory components and to retrieve data from the memory components via the controller. Various memory sub-systems include a power management component to manage power allocation.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
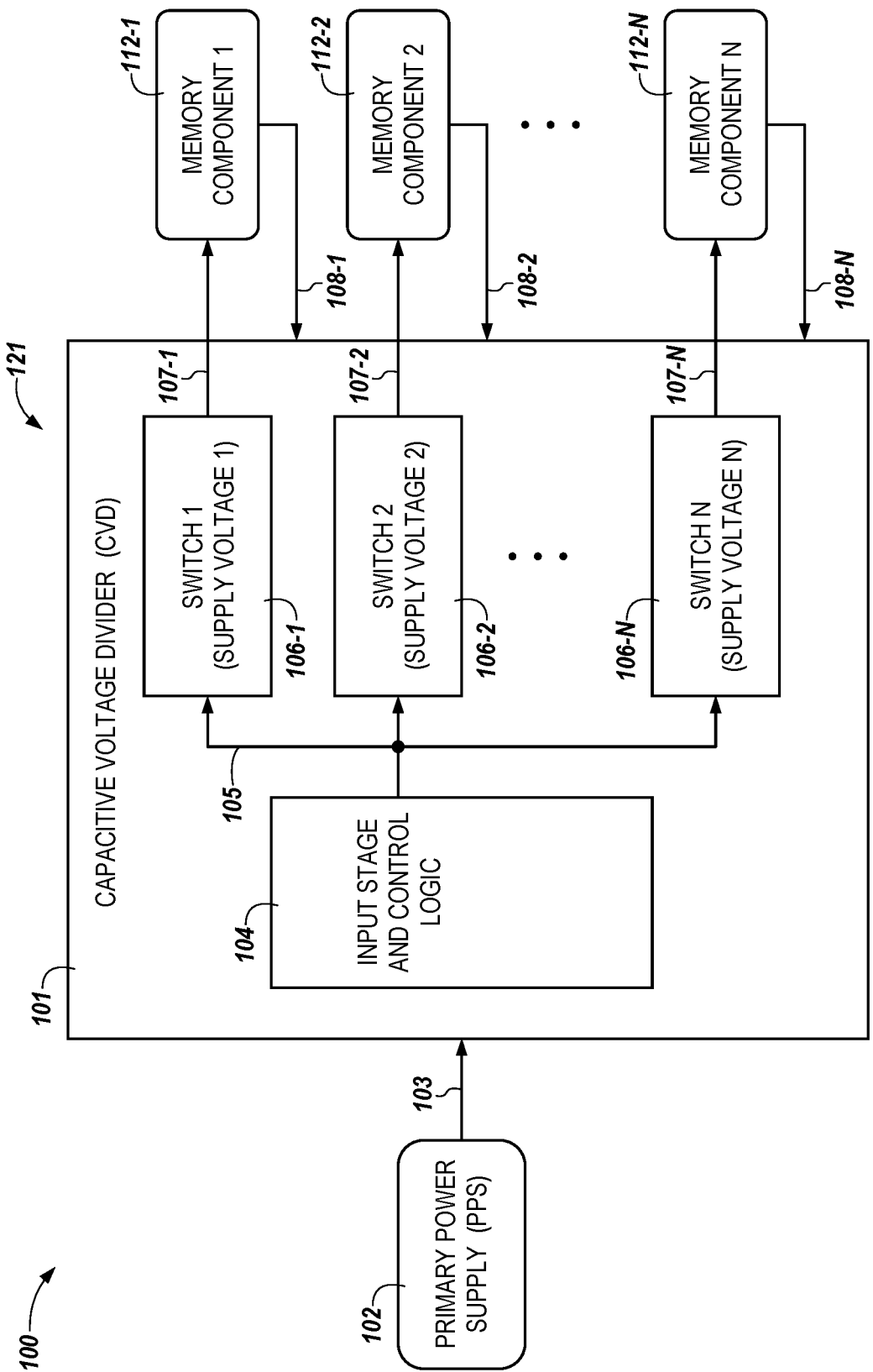
FIG. 1 illustrates an example of a computing environment that includes a memory sub-system in accordance with some embodiments of the present disclosure.

Aspects of the present disclosure are directed to a capacitive voltage divider (CVD) for monitoring multiple memory components in a memory sub-system. A "memory component," as described herein, is intended to mean a memory component that is configured to perform a particular function in the memory sub-system. Performance of each of the particular memory components can be directed via signals provided by a controller (e.g., based on commands provided by a host system). Various functions performed by the multiple memory components can include, for example, performance on data of read and/or write operations, processing of data, performance of logic operations, operations performed by application specific integrated circuitry, modulation of an input voltage for the memory sub-system to a modified voltage that is compatible with operation of other memory components, among various other operations. The types of functions being performed, and whether or not a function is being performed at any point in time by a particular memory component, can influence (e.g., determine) appropriate electrical power (e.g., voltage magnitude) to be supplied to each of the particular memory components, as described herein. As such, a status of use of each of multiple memory components can be monitored to determine the appropriate voltage magnitude to be supplied to the particular memory components being monitored.

A memory sub-system is also hereinafter referred to as a "memory device." An example of a memory sub-system is a storage system, such as a solid-state drive (SSD). The memory sub-system can be a hybrid memory/storage sub-system. The host system can utilize a memory sub-system that includes one or more memory components. The host system can provide data to be stored at the memory sub-system and can request data to be retrieved from the memory sub-system.

Various memory sub-systems can include a monitoring component to determine the amount of voltage needed to power a memory component. Memory sub-systems can also include a power management (PM) component to manage receipt of a primary supply voltage from an electrical power source and, responsive to the determination of the monitoring unit, appropriately allocate electrical power (e.g., magnitudes of voltages) so as to be compatible with operation of one or more memory components of a particular memory sub-system. Furthermore, various memory sub-systems can include a CVD to reduce and output a supply voltage to various memory components. The capacitors of the CVD can be configured to output various voltages that can be compatible with various memory components. However, conventional CVDs are limited in the number of output rails the CVD can utilize to supply voltage to various memory components.

Aspects of the present disclosure address the above, and other deficiencies, by providing multiple groups of capacitors as part of the CVD. Each group of capacitors can be connected to a separate output rail of the CVD. The CVD can be configured to output separate and distinct supply voltages to multiple memory components that are simultaneously connected to the different output rails of the CVD. The supply voltage can differ based on the parameters of the memory component.

As used herein, "memory sub-system" refers to an integrated circuit that stores information for immediate use in a computer. The primary supply voltage is also hereinafter referred to as an "input voltage."

FIG. 1 illustrates an example of a computing environment 100 that includes a memory sub-system 121. The computing environment 100 illustrated in FIG. 1 shows various components that are part of, or coupled to, the memory sub-system 121. The memory sub-system 121 can include a CVD 101. The CVD 101 can be coupled to a primary power supply (PPS) 102. As used herein, "coupled to" refers to a connection between components, which can be an indirect communicative connection or direct communicative connection (e.g., without intervening components), whether wired or wireless, including connections such as electrical, optical, magnetic, etc.

The CVD 101 can include input stage and control logic (hereinafter referred to as "control logic") 104. Control logic 104 can be used to control the path of voltage travelling through the CVD 101. As used herein, "control logic" refers to a part of a software program that controls the operations of the program. Control logic responds to commands from the user, and it also acts on its own to perform automated tasks that have been structured into the program.

The control logic 104 can communicate with multiple capacitors to configure them responsive to the parameters of various memory components 112-1, 112-2, . . . , 112-N. The memory components can be collectively referred to as 112. The memory components 112 can be connected to the switches 106-1, 106-2, . . . , 106-N. The switches can be collectively referred to as 106. The control logic 104 makes connections 105 to provide control signals to the switches 106 to select between the multiples of capacitors in switches 106 to provide voltage to the memory components 112. As used herein, a "switch" can feature multiple discrete components including multiple capacitors and switching circuitry to connect the capacitors responsive to the parameters of the memory components 112. The control logic 104 can utilize switching circuitry to supply voltage to the switches 106. The control logic 104 can use the switching circuitry to couple to the first switch 106-1 and a supply voltage to the first memory component 112-1. This can be repeated with each switch 106 in the CVD 101.

As used herein, "switching circuitry" can refer to an electronic component or device that can change the path of an electrical circuit, interrupting the current or diverting it from one conductor to another. Switching circuitry is essentially binary devices: they are either completely on ("closed") or completely off ("open"). The simplest type of switching circuitry is one where two electrical conductors are brought in contact with each other by the motion of an actuating mechanism. Other switching circuitry is more complex, containing electronic circuits able to turn on or off depending on some physical stimulus (such as light or magnetic field) sensed. In any case, the final output of any switching circuitry will be (at least) a pair of wire-connection terminals that will either be connected together by the switching circuitry's internal contact mechanism ("closed"), or not connected together ("open").

The CVD 101 can couple the supply voltage to the memory components 112 based on a clock cycle. As used herein, "clock cycle" can refer to the timing in which the switching circuitry couples to the multiple capacitors within each switch 106. The clock cycle can consist of multiple time points that correspond to each switch 106. Once the clock cycle has reached a time point, the switching circuitry can use connection 105 to couple the primary supply voltage on the connection 103 to the switches 106 that corresponds to that time point. Once the primary supply voltage has been supplied to the switches 106, the clock cycle can continue until it reaches the next time point and use connections 105 to couple the primary supply voltage on connection 103 to the switches 106 corresponding to that time point. After the switches 106 receive the primary supply voltage, the capacitors within the switches 106 convert the primary supply voltage into the modified primary supply voltage (MPSV) and supply the MPSV on connections 107-1, 107-2, . . . , 107-N as inputs to the memory components 112. The connections can be collectively referred to as 107. Once every memory component 112 has received the MPSV, the clock cycle can start over and couple the primary supply voltage on connection 103 to a first memory component 112-1, which corresponds with the first time point. This process can repeat continuously so that each memory component is receiving an MPSV as an input every clock cycle. The MPSVs can be output to the different memory components substantially simultaneously (e.g., within the same clock cycle).

Each switch 106 can include multiple capacitors. The capacitors within each switch 106 can be configured to reduce the primary supply voltage responsive to the voltage parameters of the memory component 112 connected to the switch 106. Different numbers of capacitors configured in different ways can change the amount by which the primary supply voltage is reduced. The capacitors can be configured to scale (e.g., divide the primary supply voltage by ½, ⅓, etc., or other into fractions not based on simple integers) the primary supply voltage once before outputting the MPSV, and/or the capacitors can be configured to scale the primary supply voltage multiple times and output an average voltage resulting from such scaling as the MPSV. Each memory component 112 can send status of use information on connections 108-1, 108-2, . . . , 108-N to the CVD 101 which can allow the CVD 101 to determine what particular MPSV to supply to each memory component 112. The connections can be collectively referred to as 108. The status of use of each memory component 112 can be determined based on a signal provided for the activation of the memory components and whether the signal provided is monitored by the monitoring unit (as shown at 341 and described in connection with FIG. 3).

The memory components 112 can vary at the different switches 106. There can be different memory components 112 with different voltage parameters connected to different switches 106 simultaneously. As used herein, a "memory component" can refer to a discrete device or physical entity configured to operate within a memory sub-system. Memory components, as described herein, can include ferroelectric RAM, NOR flash, programmable read-only memory (e.g., FPROM, EEPROM, OTP NVM, etc.) and/or RAM, among other volatile and/or non-volatile memory. The memory can store instructions for the processing resource to execute. The memory components also can include voltage converters, as described herein, associated with a power management component configured to adjust a particular input voltage so as to be compatible with operation of other memory components. As such, the memory components described herein can include a power management integrated circuit (PMIC) (e.g., as shown at 212-1 and described in connection with FIG. 2) and a number of memory arrays (e.g., as shown at 212-2, . . . , 212-N and described in connection with FIG. 2). In a number of embodiments, the memory components also can include a controller and/or circuitry associated therewith, such as control circuitry, input/output (I/O) circuitry, address circuitry, etc., among other possible memory components.

Figure 2:
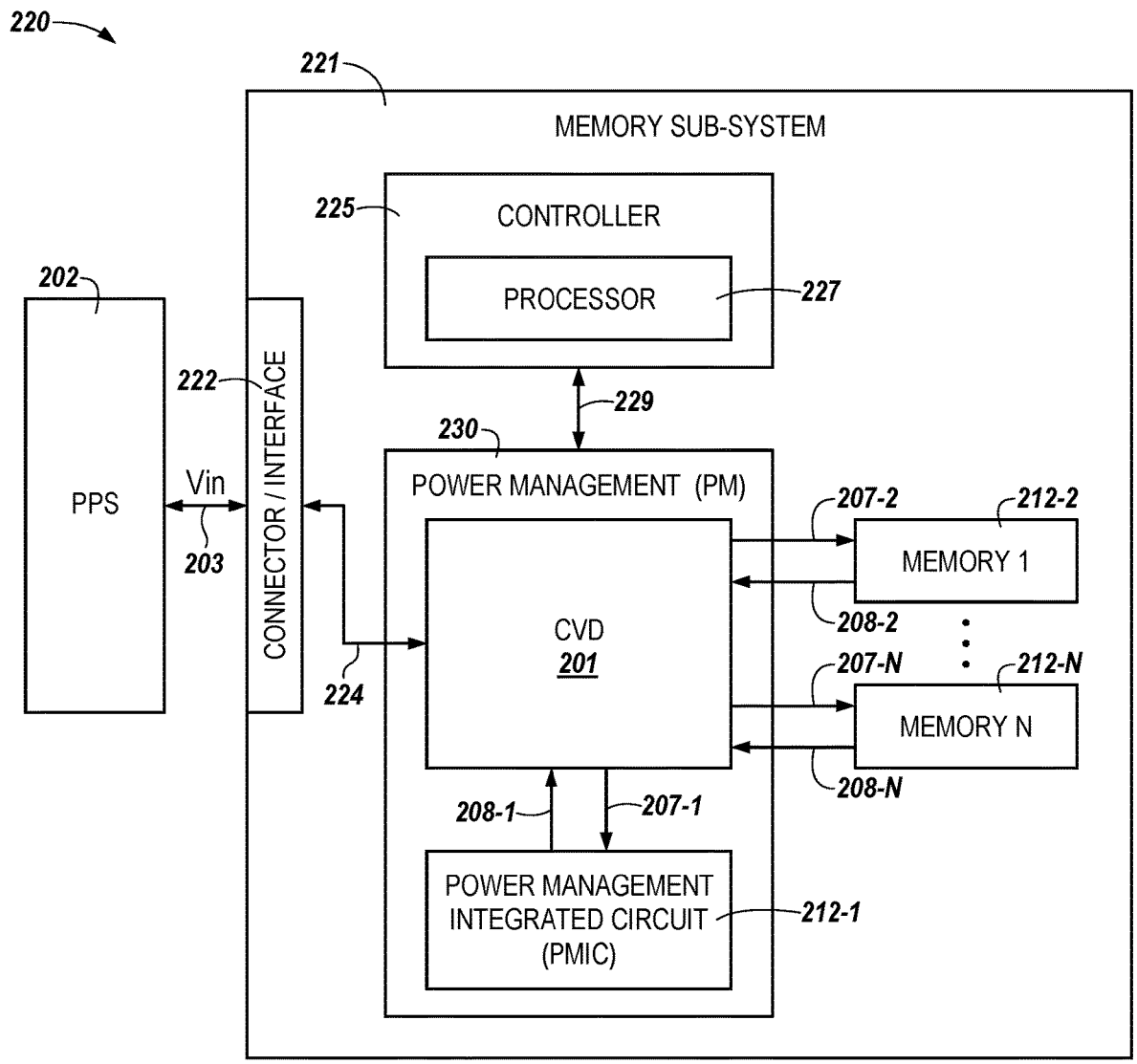
FIG. 2 illustrates an example computing environment that includes a memory sub-system in accordance with some embodiments of the present disclosure.

FIG. 2 illustrates an example computing environment 220 that includes a memory sub-system 221. The computing environment 220 illustrated in FIG. 2 shows various components that are part of, or that are coupled to, the memory sub-system 221. A PPS 202 can be coupled to the memory sub-system 221.

The memory sub-system 221 can include a PM component 230. The PM component 230 can include a CVD 201 and a power management integrated circuit (PMIC). The PMIC can be one of multiple memory components 212 coupled to the memory sub-system 221. The PMIC is illustrated in FIG. 2 as 212-1. The PM component 230 of the memory sub-system 221 can be coupled to a memory device controller 225 (hereinafter referred to as "controller") through connection 229.

The PM component 230 on memory sub-system 221 can include multiple components configured to contribute to the performance of power management operations. The PM component 230 can include a PMIC 212-1 compatible with operation at an uppermost PMIC supply voltage that is lower than the primary supply voltage of the memory sub-system 221 received from the PPS 202 on connection 203. The PMIC 212-1 can be configured to output one or more voltages for operation of the memory sub-system 221 based on a PMIC supply voltage. The voltages to be output can be determined based on the conversion of the PMIC supply voltage to one or more reduced voltages corresponding to voltages compatible with operation of one or more components of the memory sub-system 221, which can include controller 225, memory components 212-2, . . . , 212-N, and/or circuitry associated therewith, such as control circuitry, input/output (I/O) circuitry, address circuitry, etc.

As used herein, stating that a voltage is "compatible with" operation of a particular component is intended to mean that supplying a higher voltage can inactivate (e.g., rupture, burn out, etc.) a fuse, a transistor, a capacitor, etc., of a component configured to operate in a lower voltage range or that supplying a lower voltage can be below a voltage threshold for operation of the component. The primary supply voltage can be 12V or higher and a voltage compatible with operation of the PMIC 212-1 and/or the components thereof can be around 4V.

The PM component 230 can include a CVD 201 coupled to the PMIC 212-1. The CVD 201 can be configured to receive the primary supply voltage on connection 203 as an input ($V_{in}$) and provide the MPSV to the PMIC 212-1 as the PMIC supply voltage. The primary supply voltage can be received via a connector/interface 222 from the PPS 202 of the memory sub-system 221. The MPSV can be a voltage that has been converted by the CVD 201 from the primary supply voltage to a voltage that is not higher than the uppermost PMIC supply voltage compatible with PMIC 212-1 (e.g., a voltage within a range of 3-5V).

The CVD 201 can be configured to receive, as input, multiple different primary supply voltages that are higher than the uppermost PMIC supply voltage. The primary supply voltages can range from being greater than the uppermost PMIC supply voltage (e.g., 5V) to being 240V or more. The CVD 201 can be configured to reduce each of the different primary supply voltages to provide the MPSV to the PMIC 212-1 as the PMIC supply voltage compatible with operation of the PMIC 212-1. The CVD 201 can be configured to divide the different primary supply voltages to produce the MPSV such that the MPSV can be selectably determined to provide the PMIC supply voltage compatible with operation of the PMIC 212-1. Producing the MPSV can be performed by selectably connecting multiple capacitors of the CVD 201 in multiple configurations.

The CVD 201 can be configured to selectably adjust (e.g., reduce) the input 203 to the MPSV via multiple series-coupled capacitors being selectably connected into multiple configurations. The configuration of the connections and/or how many of the multiple capacitors are selectably connected can depend on how high the primary supply voltage is and/or an amount that the primary supply voltage is to be reduced to be compatible with operation of the memory components. For example, capacitors connected (coupled) in series can be utilized for scaling (e.g., reduction) of the primary supply voltage to a number of MPSVs compatible with operation of the PMIC 212-1 in order to be output to the PMIC 212-1 and/or compatible with operation of an number of memory components 212-2, . . . , 212-N.

The PMIC 212-1 can include multiple regulators operable as a voltage converter component (e.g., as shown at 348 and described in connection with FIG. 3). The PMIC 212-1 can be configured to convert the MPSV received from the CVD 201 to multiple voltages, for operation of various components of the memory sub-system 221, to be output from the PMIC 212-1. The multiple regulators of the PMIC 212-1 can include a first regulator (e.g., a buck-boost converter 350 and/or a buck converter 351 described in connection with FIG. 3) configured to reduce the MPSV received from the CVD 201 on connection 207-1 to one or more voltages compatible with the operation of various memory components. The PMIC 212-1 can be configured to reduce the MPSV to a reduced voltage compatible with operation of an array of memory cells of the memory sub-system 221 and the reduced voltage can be selectably output from the PMIC 212-1 for operation of the array. The voltage converter component 348 of the PMIC 212-1 can include a second regulator (e.g., the buck-boost converter 350 and/or a boost converter 352 described in connection with FIG. 3) configured to increase the first MPSV received from the CVD 201 for operation of one or more components of the memory sub-system 221.

The PMIC 212-1 can include a voltage converter component (e.g., as shown at 348 and described in connection with FIG. 3). The voltage converter component can include a buck regulator, among other types of regulators, configured to operate on a first reduced voltage (e.g., the MPSV) and to provide a second reduced voltage compatible with operation of the memory components. The second reduced voltage can be a further reduced voltage at output 353 and described in connection with FIG. 3. The primary supply voltage can be 12V and the MPSV output from the CVD 201 for operation of the PMIC 212-1 can be 4V, and the voltage output from the PMIC 212-1 as the further reduced voltage for the operation of an array of memory cells can be around 1 V. The CVD 201 can perform the first reduction in order to achieve the MPSV for output to the PMIC 212-1 by using the CVD's 201 multiple capacitors configured to be connected in a configuration to produce the MPSV.

Memory sub-system 221 can include one or more memory components 212-2, . . . , 212-N coupled to the CVD 201 through connections 207-2, . . . , 207-N. The PMIC 212-1 and the memory components 212-2, . . . , 212-N provide status of use information to the CVD 210 on connections 208-1, 208-2, . . . , 208-N. Memory components 212-2, . . . , 212-N can include any combination of different types of non-volatile memory (NVM) components and/or volatile memory (VM) components. The memory components can include at least one array of VM cells, at least one array of NVM cells, or at least one array of the VM cells in combination with at least one array of the NVM cells. The memory sub-system 221 can be a storage system. An example of a storage system is an SSD. The memory sub-system 221 can be an SSD or the memory sub-system 221 can be formed as part of an SSD. For example, the memory sub-system 221 can be a hybrid memory/storage sub-system.

Each of the memory components 212-2, . . . , 212-N can include one or more arrays of memory cells such as single level cells (SLCs) or multi-level cells (MLCs). The MLCs can include triple level cells (TLCs) and/or quad-level cells (QLCs). A particular memory component can include both an SLC portion and an MLC portion of memory cells. Each of the memory cells can store one or more bits of data (e.g., data blocks).

An example of NVM components includes a negative-and (NAND) type flash memory. Although NVM components such as NAND type flash memory are described, the memory components 212-2, ..., 212-N can be based on various other types of memory, such as VM. The memory components 212-2, ..., 212-N can be, but are not limited to, random access memory (RAM), read-only memory (ROM), dynamic random-access memory (DRAM), synchronous dynamic random-access memory (SDRAM), phase change memory (PCM), magneto random access memory (MRAM), NAND flash memory, negative-or (NOR) flash memory, electrically erasable programmable read-only memory (EEPROM), and a cross-point array of NVM cells. A cross-point array of NVM can perform bit storage based on a change of bulk resistance, in conjunction with a stackable cross-gridded data access array. Additionally, in contrast to many flash-based memories, cross-point NVM can perform a write in-place operation, where an NVM cell can be programmed without the NVM cell being previously erased. Furthermore, the memory cells of the memory components 212-2, ..., 212-N can be grouped as memory pages or data blocks that can refer to a unit of the memory component used to store data.

The PPS 202 can be an electrical power source that can supply the primary supply voltage on connection 203 for input ($V_{in}$) to the memory sub-system 221 for operation of the PMIC 212-1 and/or the memory components 212-2, ..., 212-N, among other components of the memory sub-system 221. The PPS 202 can be an electrical outlet, a battery, and/or an AC/DC converter, among other possible power sources. The primary supply voltage can be higher than a voltage compatible with operation of the PMIC 212-1.

The controller 225 can communicate with the memory components 212-2, ..., 212-N to perform operations such as reading, writing, and/or erasing data at the memory components 212-2, ..., 212-N and other such operations. The controller 225 can include hardware such as one or more integrated circuits and/or discrete components, a buffer memory, or a combination thereof. The controller 225 can be a microcontroller, special purpose logic circuitry (e.g., a field programmable gate array (FPGA), an application specific integrated circuit (ASIC), etc.), or any other suitable processor. The controller 225 can include a processing device (e.g., processor 227) configured to execute instructions stored in local memory (not shown). The local memory of the controller 225 can include an embedded memory configured to store instructions for performing various processes, operations, logic flows, and/or routines that control operation of the memory sub-system 221, including handling communications between the memory sub-system 221 and a host (not shown). The local memory can include memory registers storing memory pointers, fetched data, etc. The local memory also can include read-only memory (ROM) for storing micro-code.

While the memory sub-system 221 shown in FIG. 2 has been illustrated as including the controller 225, in other embodiments of the present disclosure, a memory sub-system 221 may not include a controller 225 and can instead rely upon external control. Such external control can be provided by an external host and/or by a processor or controller separate from the memory sub-system 221.

The controller 225 can receive commands for operations from a host system (not shown and hereinafter referred to as a "host") and can convert the commands for operations into instructions or appropriate commands to achieve access to the memory components 212-2, ..., 212-N for performance of such operations. The controller 225 can be responsible for other operations such as wear leveling operations, garbage collection operations, error detection and error-correcting code (ECC) operations, encryption operations, caching operations, and/or address translations between a logical block address and a physical block address that are associated with the memory components 212-2, ..., 212-N. The controller 225 can communicate with the host via a physical host interface (e.g., connector/interface 222).

The memory sub-system 221 also can include additional circuitry or components that are not illustrated. The memory components 212-2, ..., 212-N can include control circuitry, address circuitry, sensing circuitry, and/or input/output (I/O) circuitry by which the memory components 212 can communicate with controller 225 and/or host. The control circuitry can include a power control component shown at 342 in FIG. 3, among other control circuitry. The address circuitry can include row and column decode circuitry. The address circuitry can receive an address from the controller 225 and decode the address to access the memory components 212-2, ..., 212-N. The sensing circuitry can include circuitry by which data values can be written at and/or read from a particular memory cell corresponding to an address in a row and/or column of an array.

The computing environment 220 can include a host (not shown) that can utilize the memory sub-system 221 that includes the one or more memory components 212. The PPS 202 can be on and/or be coupled to the host and/or the primary supply voltage can come from the host. The host can provide data to be stored (written) at the memory sub-system 221 and/or can request data to be retrieved (read) from the memory sub-system 221. The memory sub-system 221 can include multiple interface connections (e.g., ports) to one or more hosts. A host can send data commands (e.g., read, write, erase, program, etc.) to the memory sub-system 221 via a port.

The host can be a computing device such as a desktop computer, laptop computer, network server, mobile device, or such computing device that includes a memory and a processing device. The host can include, or be coupled to, the memory sub-system 221 so that the host can read data from or write data to the memory sub-system 221. The host can be coupled to the memory sub-system 221 via a physical host interface (e.g., connector/interface 222). The physical host interface can include control, address, data bus components, etc., to provide an interface for passing control, address, data, and other signals between the memory sub-system 221 and the host. Examples of a physical host interface can include, but are not limited to, a serial advanced technology attachment (SATA) interface, a peripheral component interconnect express (PCIe) interface, universal serial bus (USB) interface, Fibre Channel, Serial Attached SCSI (SAS), etc. The host can further utilize an NVM Express (NVMe) interface to access the memory components 212-2, ..., 212-N when the memory sub-system 104 is coupled with the host by the PCIe interface.

Figure 3:
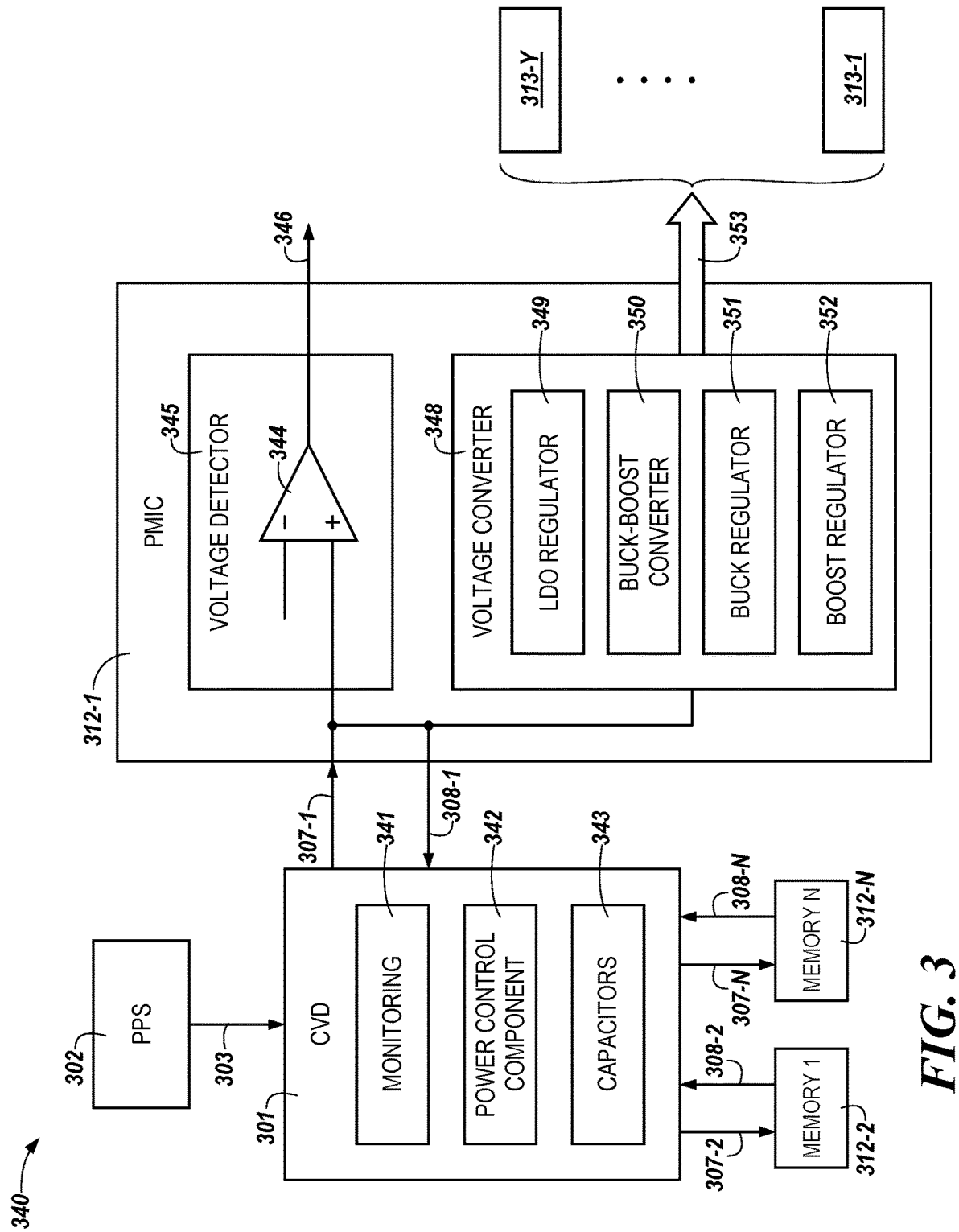
FIG. 3 illustrates an example of a power management component in accordance with some embodiments of the present disclosure.

FIG. 3 illustrates an example of a power management (PM) component 340. PM component 340 can be PM component 230 shown in FIG. 2. The PM component 340 can include the CVD 301 and the PMIC 312-1 shown in FIG. 3, which can be used to manage various power parameters of the memory sub-system 104, memory components 312-2, ..., 312-N, and/or other electronic devices coupled thereto.

The PMIC 312-1 can include one or more components configured to provide multiple levels of electrical power (e.g., voltages) that are compatible with the operation of memory components, among others, of the memory sub-system 221. The PMIC 312-1 can include a voltage detector 345 and a voltage converter component 348. The embodiment of the PMIC 312-1 illustrated in FIG. 3 is shown by way of example and embodiments are not limited as such. Hence, a PMIC consistent with this disclosure can include more or less components than are shown in FIG. 3.

The voltage detector 345 can detect whether the MPSV exceeds a range of voltages compatible with operation of the PMIC 312-1. The voltage detector 345 can generate a power-off signal at output 346 based on a result of detection of such a MPSV. The power-off signal 346 can be sent to enable a disconnect of the PPS 302, the connector/interface 222, and/or the CVD 301 from supplying such a MPSV. The voltage detector 345 can include a comparator 344 that compares the MPSV to a reference voltage and outputs the power-off signal at output 346 as a result of the comparison. When an uppermost voltage (e.g., MPSV) compatible with operation of the PMIC 312-1 is 5V, the reference voltage can be set to 5V. A range of MPSVs and a corresponding reference voltage can be set to various voltage magnitudes. The comparator 344 can generate the power-off signal at output 346 at a logic high level when the MPSV is higher than a first reference voltage and can generate the power-off signal 346 at a logic low level when the MPSV is lower than a second reference voltage. The first reference voltage can be higher than the second reference voltage.

The voltage converter component 348 can provide a further reduced voltage compatible with the operation of additional memory components 313-1, ..., 313-Y. The further reduced voltage can be provided to the additional memory components 131-1, ..., 313-Y at output 353. The voltage converter component 348 can include a low-dropout (LDO) regulator 349, a buck-boost converter 350, a buck regulator 351, and/or a boost regulator 352.

The LDO regulator 349 can be a linear voltage regulator that operates with a very small input-output differential voltage that can regulate an output voltage of the buck-boost converter 350 to output the further reduced voltage at output 353. Multiple LDO regulators 349 can be provided based on the number of further reduced voltages at output 353 that are used in the memory sub-system 221 of FIG. 2.

The buck-boost converter 350 can detect the MPSV and can operate in a buck-mode when the MPSV is higher than an intended further reduced voltage to be output from the buck-boost converter 350. The buck-boost converter 350 can operate in a boost-mode when the detected MPSV is lower than an intended voltage to be output from the buck-boost converter 350. The buck-boost converter 350 can contribute to output of a constant voltage.

The buck regulator 351 can be a voltage reduction-type direct current (DC)/DC converter that can generate a predetermined output voltage by reducing an input voltage (e.g., reducing the MPSV to the further reduced voltage at output 353). The buck regulator 351 can use a switching circuitry that is turned on/off in a certain period and can have a structure in which an input power supply (e.g., the MPSV) is connected to a circuit while the switch is turned on and is not connected to the circuit while the switch is turned off. The buck regulator 351 can output a DC voltage by averaging, through an inductor-capacitor (LC) filter, a voltage having a pulse shape that is periodically connected to or disconnected from a circuit in this manner. The buck regulator 351 can use a principle of generating an output voltage by averaging a pulse voltage by periodically chopping a DC voltage such that the output voltage of the buck regulator 351 (e.g., the further reduced voltage at output 353) can have a voltage that is less than an input voltage (e.g., the first MPSV) of the buck regulator 351.

The boost regulator 352 can be a voltage boost-type DC/DC converter. In the boost regulator 352, when a switch is turned on, the MPSV can be connected to two terminals of an inductor to form a charge current. When the switch is turned off, the charge current can be transferred to a load. Accordingly, the amount of current of an output terminal of the boost regulator 352 can be less than that of an input terminal of the boost regulator 352. Since there is no loss due to an operation principle of the boost regulator 352, an output voltage of the boost regulator 352 can be higher than an input voltage (e.g., the MPSV) of the boost regulator 352, based on an "input current*input voltage=output current*output voltage" relationship.

The CVD 301 can be coupled to the PMIC 312-1 through the connection 307-1 and can be configured to decrease the primary supply voltage, received from the PPS 302, to the MPSV. The decrease can be selectably determined to provide the PMIC 312-1 with a supply voltage that is lower than the primary supply voltage and that is compatible with operation of the PMIC 312-1.

The CVD 301 can be configured to, based on a status of use information of the memory components on connections 308-1, 308-2, ..., 308-N, provide signals to select between multiple different connections of the multiple capacitors 343 of the CVD 301. The connections can be collectively referred to as 308. Responsive to a determination by the monitoring unit 341 that the primary supply voltage is above a range of voltages compatible with operation of the PMIC 312-1 and the memory components 312-2, ..., 312-N, the monitoring unit 341 can send a signal to the PCC 342 that is part of the CVD 301. The PCC 342 can be configured to determine a particular number of the multiple capacitors 343 of the CVD 301 to connect to reduce a particular voltage magnitude of the primary supply voltage to the MPSV compatible with operation of the PMIC 312-1 and the memory components 312-2, ..., 212-N, direct the CVD 301 to connect the particular number of the multiple capacitors 343, and direct the CVD 301 to output the MPSV to the PMIC 312-1 and the memory components 312-2, ..., 312-N. The MPSV is output to the PMIC 312-1 and the memory components 312-2, ..., 312-N through connections 308-1, 308-2, ..., 308-N.

Responsive to a determination by the monitoring unit 341 that the primary supply voltage is above a voltage magnitude and/or voltage range in which the CVD 301 is configured to modify the primary supply voltage to a voltage less than or equal to the uppermost PMIC 312-1 supply voltage, the monitoring unit 341 can be configured to send a signal (e.g., to the connector/interface 222) to interrupt and/or block input of the primary supply voltage. The primary supply voltage can be interrupted and/or blocked when a particular number of the multiple capacitors 343 of the CVD 301 is not enough to divide a particular voltage magnitude of the primary supply voltage (e.g., because the primary supply voltage is too high for the particular number of capacitors), and/or when none of the multiple different connections of the multiple capacitors 343 are configurable to divide the particular voltage magnitude of the primary supply voltage, to provide a particular MPSV in a range of voltages compatible with operation of the PMIC 312-1. The monitoring unit 341 can be configured to send a signal to the PCC 342 to alternatively modify the primary supply voltage to produce the MPSV and/or to reduce (e.g., prevent) output of a MPSV from the CVD 301 to the PMIC 312-1. Alternatively modifying the primary supply voltage can be performed using a differently configured CVD, among other possible alternatives. Interrupting and/or blocking input of the primary supply voltage, alternatively modifying the input 303, and/or preventing output of the MPSV can reduce potential damage to the PMIC 312-1 (e.g., components of the voltage converter 348).

Figure 4:
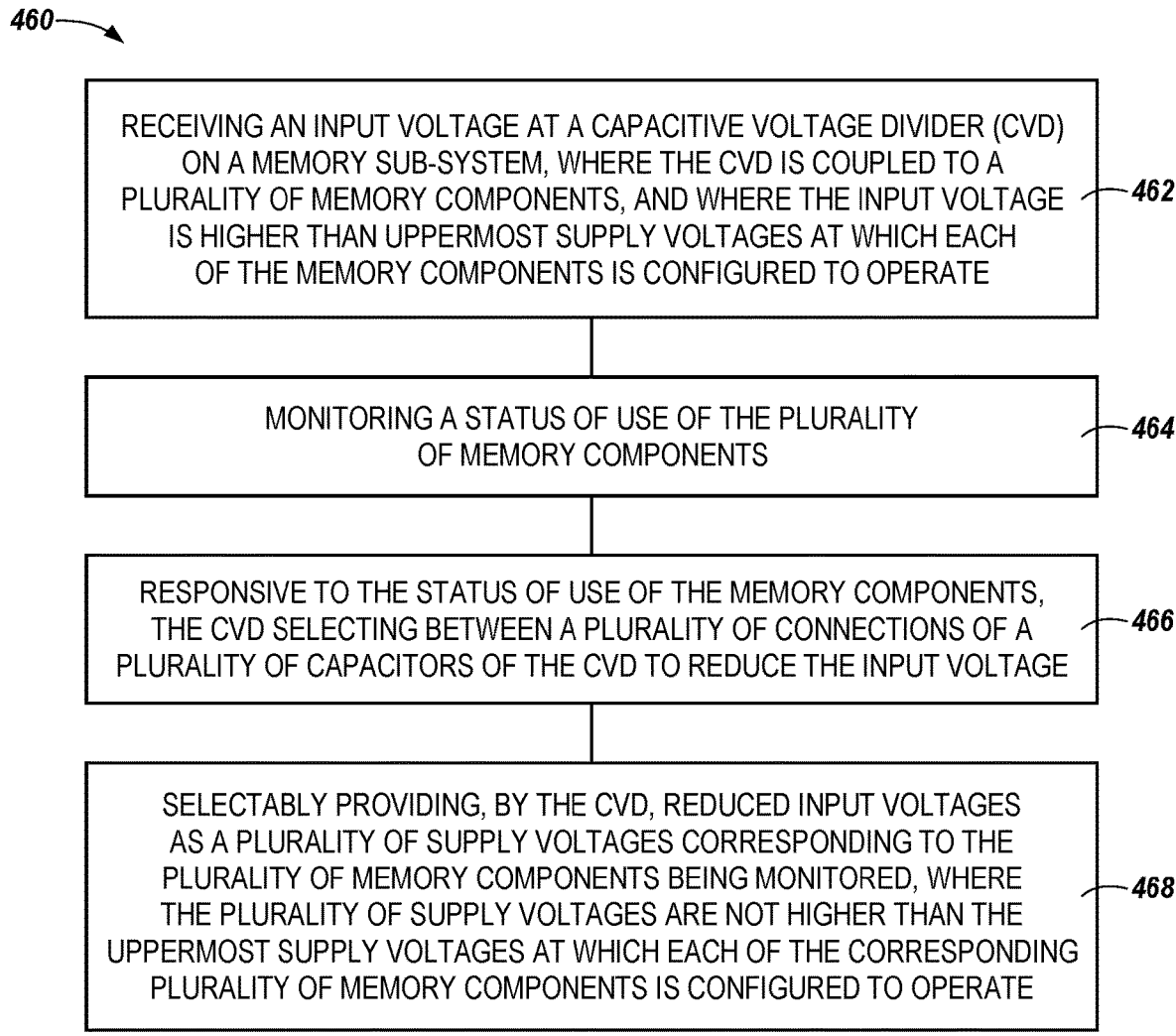
FIG. 4 is a flow diagram of an example method to operate a capacitive voltage divider in accordance with some embodiments of the present disclosure.

FIG. 4 is a flow diagram of an example method 460 to operate a CVD. The method 460 can be performed by processing logic that can include hardware, software, or a combination thereof. Such hardware can include one or more of a processing device, circuitry, dedicated logic, programmable logic, microcode, integrated circuit, etc.

The method 460 can be performed by one or more components of the CVD, PPS, and the memory components and is described in connection with FIG. 1. Although shown in a particular sequence or order, unless otherwise specified, the order of the processes in the method 460 can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 462, the CVD can receive the primary supply voltage on the memory sub-system (e.g., SSD). The CVD can be coupled to multiple memory components. The magnitude of the primary supply voltage can be determined by a voltage detector (not shown) communicating with the monitoring unit that is part of the CVD. The primary supply voltage can be higher than the uppermost supply voltages at which each of the memory components is configured to operate.

At block 464, the monitoring unit can monitor the statuses of use of the multiple memory components. The monitoring unit can receive status of use information from the memory components regarding the voltage needs of the memory components. The status of use information can include a voltage presently being received by a memory component and the monitoring unit can determine whether the received voltage corresponds to an appropriate supply voltage range to enable operation of the memory component. Responsive to a determination that the received voltage is not within the appropriate supply voltage range, the PCC can be configured to direct output of a particular supply voltage that is within the appropriate supply voltage range to the particular memory component.

At block 466, responsive to the status of use of the memory components, the CVD can select between multiple connections of multiple capacitors of the CVD to reduce the primary supply voltage. Different configurations of the capacitors can produce different input voltages.

At block 468, the CVD can selectably provide reduced input voltages as multiple supply voltages corresponding to the multiple memory components being monitored. The multiple supply voltages are not higher than (e.g., are equal to or lower than) the uppermost supply voltages at which each of the corresponding memory components is configured to operate.

Figure 5:
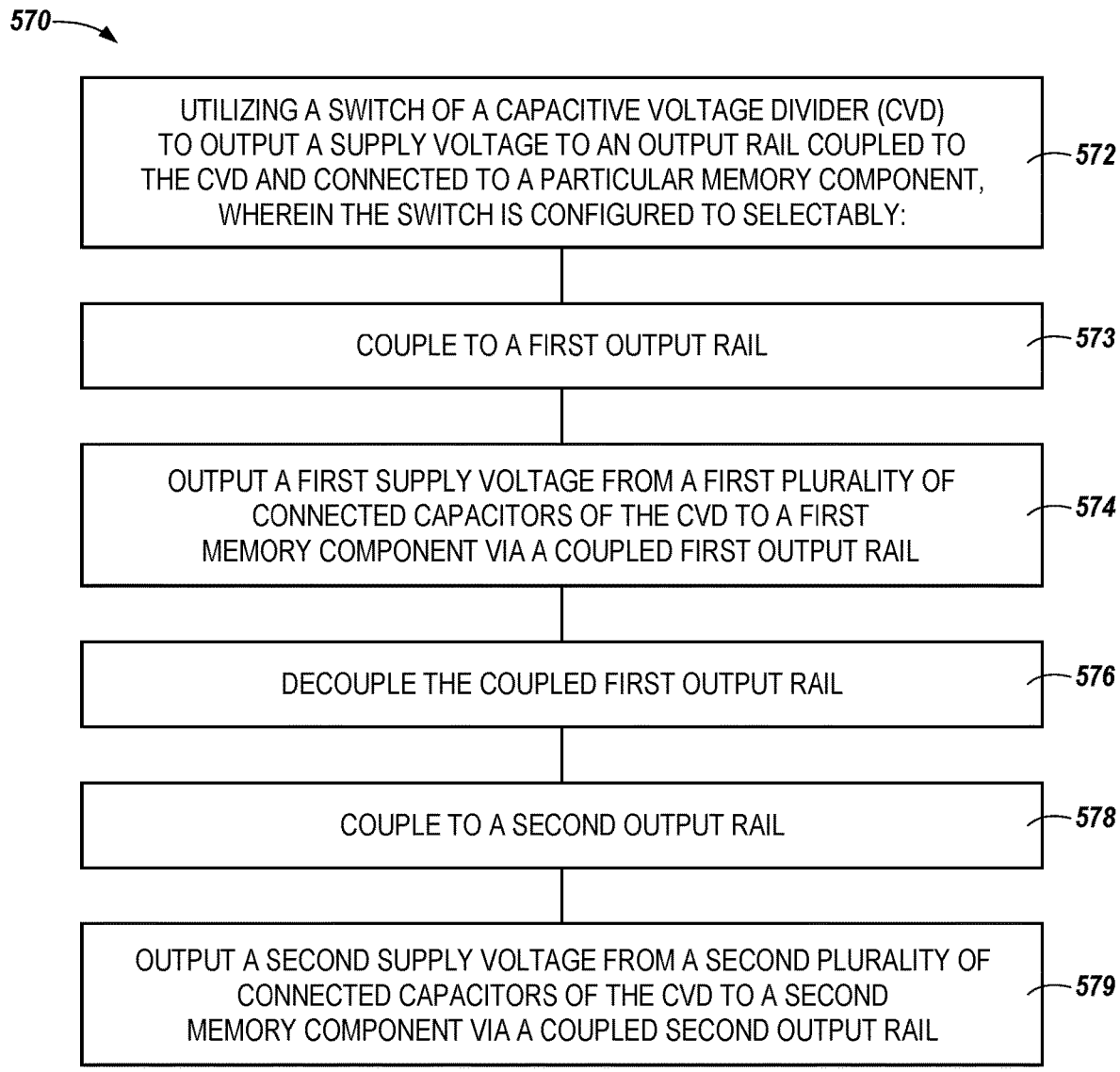
FIG. 5 is an additional flow diagram of the example method illustrated in FIG. 4 in accordance with some embodiments of the present disclosure.

FIG. 5 is an additional flow diagram 570 of the example method 460 illustrated in FIG. 4. At block 572, the CVD can utilize a switch to output a supply voltage to an output rail coupled to the CVD and connected to a particular memory component. The CVD can utilize switching circuitry to couple an input rail to a switch. This coupling can allow the primary supply voltage to travel to the switch through the switching circuitry.

At block 573, the switch can be configured to selectably couple to a first output rail. The switch can feature multiple capacitors to convert the primary supply voltage into the MPSV. The number and configuration of the capacitors can determine the magnitude of the MPSV.

At block 574, the switch can be configured to selectably output a first supply voltage from a first multiple of connected capacitors of the CVD to a first memory component via a coupled first output rail. The supply voltage can be based on a determination of the voltage requirements of the memory component. The voltage needs can be determined by monitoring the memory component with a monitoring component.

At block 576 the switch can be configured to selectably decouple the coupled first output rail. The switching circuitry can operate according to a clock cycle. The clock cycle can feature different time points that correspond to different memory components. The switching circuitry can couple to and decouple from different memory components according to the clock cycle.

At block 578, the switch can be configured to selectably couple to a second output rail. The second memory component can be connected to the second output rail. According to the clock cycle, after the first memory component receives voltage from the CVD, the switching circuitry can couple to the second output rail.

At block 579, the switch can be configured to selectably output a second supply voltage from a second multiple of connected capacitors of the CVD to a second memory component via a coupled second output rail. According to the clock cycle, after the first memory component receives voltage, the second memory component can receive voltage.

Figure 6:
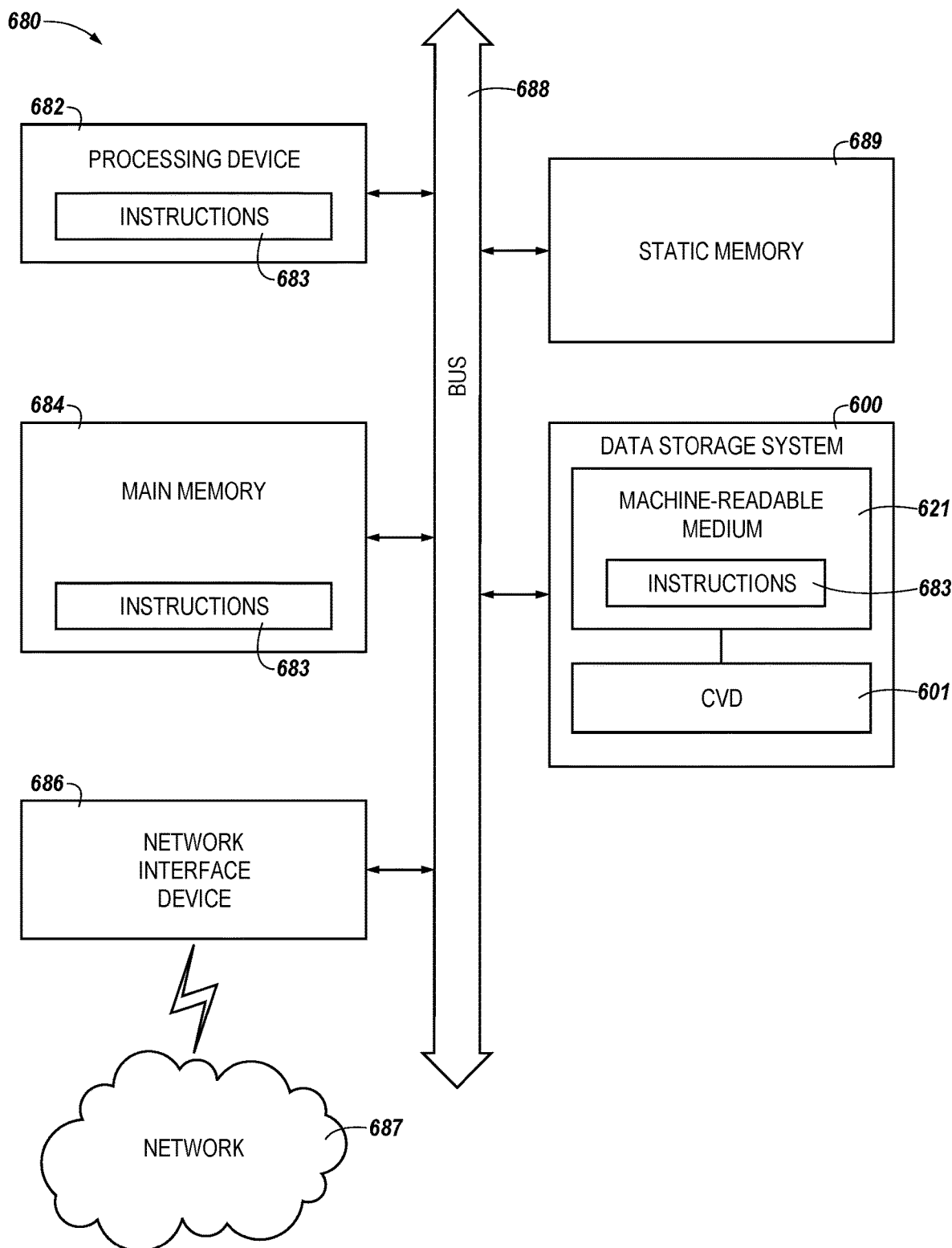
FIG. 6 is a block diagram of an example computer system in which embodiments of the present disclosure can operate.

FIG. 6 illustrates an example machine of a computer system 680 within which a set of instructions, for causing the machine to perform any one or more of the methodologies discussed herein, can be executed. The computer system 680 can correspond to a host system (e.g., the host system described in connection with FIG. 2) that includes, is coupled to, and/or utilizes a memory sub-system such as the memory device/SSD 221 of FIG. 2. The computer system 680 can be used to execute operations of a controller 225 and/or processor 227 on an operating system to perform operations, including the operations performed by the PM component 230 of FIG. 2 and/or the PM component 340 of FIG. 3). The machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The computer system 680 includes a processing device 682, a main memory 684, a static memory 689, and a data storage system 600, which communicate with each other via a bus 688. The main memory 684 can be read-only memory (ROM), flash memory, dynamic random-access memory (DRAM), such as synchronous DRAM (SDRAM) or Rambus DRAM (RDRAM), among other possibilities. The static memory 689 can be flash memory, static random-access memory (SRAM), among other possibilities. The data storage system 600 can correspond to the memory sub-system, the memory device, and SSD 221 described in connection with FIG. 2.

Processing device 682 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 682 can also be one or more special-purpose processing devices such as an application specific integrated circuit (ASIC), a field programmable gate array (FPGA), a digital signal processor (DSP), network processor, or the like. The processing device 682 is configured to execute instructions 683 for performing the operations and steps discussed herein. The computer system 680 can further include a network interface device 686 to communicate over a network 687.

The data storage system 600 can include a machine-readable storage medium 621 (also known as a computer-readable medium) on which is stored one or more sets of instructions 683 or software embodying any one or more of the methodologies or functions described herein. The instructions 683 also can reside, completely or at least partially, within the main memory 684 and/or within the processing device 682 during execution thereof by the computer system 680. The main memory 684 and the processing device 682 also contribute to the machine-readable storage media. The machine-readable storage medium 621, data storage system 600, and/or main memory 684 can correspond to the memory sub-system 221 of FIG. 2.

The instructions 683 can include instructions to implement memory components corresponding to a power management component. The memory components can correspond to the memory components of the PM component 340 of FIG. 3, including the CVD 301 and the PMIC 312-1, among others. While the machine-readable storage medium 621 is shown to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that can cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data values (bits) within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description herein. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). A machine-readable (e.g., computer-readable) medium includes a machine-readable storage medium, such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:
   a plurality of memory components, wherein at least two of the memory components are configured to operate at different supply voltages; and
   a capacitive voltage divider (CVD) configured to, responsive to a status of use of each of the memory components, select between a plurality of connections of a plurality of capacitors to reduce an input voltage of the memory sub-system; wherein:
the plurality of connections is configured to provide different voltage magnitudes that correspond to the different supply voltages; and
the CVD is further configured to output the different supply voltages to enable the use of each of the memory components, wherein the different supply voltages are output substantially simultaneously based on configuring a first subset of the plurality of connections to provide a first voltage magnitude and configuring a second subset of the plurality of connections to provide a second voltage magnitude that is different from the first voltage magnitude.

2. The memory sub-system of claim 1, wherein:
the CVD is further configured to output the different supply voltages via a plurality of output rails; and
each output rail of the plurality is coupled to one of the plurality of memory components.

3. The memory sub-system of claim 1, wherein the CVD is further configured to produce the reduced input voltage corresponding to the different supply voltages by:
one scaling of the input voltage to output at least one of the different supply voltages; and
a plurality of scalings of the input voltage to output an average voltage for at least one of the different supply voltages.

4. The memory sub-system of claim 1, wherein the CVD is further configured to separately output the different supply voltages, responsive to the status of use of each of the plurality of memory components, via a corresponding plurality of output rails.

5. The memory sub-system of claim 1, wherein the different supply voltages are output separately based on reconfiguring the plurality of connections to provide the different voltage magnitudes.

6. The memory sub-system of claim 1, wherein:
the status of use of each of the plurality of memory components is determined based on whether a signal is provided for activation of a particular memory component; and
whether the signal is provided is monitored by a monitoring unit that is part of the CVD.

7. A memory sub-system, comprising:
a capacitive voltage divider (CVD) comprising a plurality of capacitors, wherein the CVD is configured to select between a plurality of connections of the capacitors to modify an input voltage of the memory sub-system;
wherein the CVD is formed on the memory sub-system and comprises:
a monitoring unit configured to monitor a particular supply voltage to be supplied by the CVD to each of a plurality of memory components, wherein a first supply voltage for a first memory component is different from a second supply voltage for a second memory component;
a power control component (PCC) configured to:
determine, responsive to a signal from the monitoring unit, the particular supply voltage to be supplied to a particular memory component;
determine a particular number of the plurality of capacitors to connect to enable output of a particular voltage magnitude that corresponds to the particular supply voltage of the particular memory component;
direct connection of the particular number of the plurality of capacitors; and
direct output of the particular supply voltage to the particular memory component.

8. The memory sub-system of claim 7, wherein the memory sub-system is a solid-state drive (SSD).

9. The memory sub-system of claim 7, wherein a first capacitor of the plurality of capacitors is configured to connect in parallel and in series with a second capacitor of the plurality of capacitors.

10. The memory sub-system of claim 7, wherein the monitoring unit is further configured to determine the particular supply voltage to be supplied to the particular memory component based on a particular operation to be performed by the particular memory component.

11. The memory sub-system of claim 7, wherein:
the monitoring unit is further configured to monitor the particular supply voltage to be supplied to each of the plurality of memory components in a clock cycle having a plurality of sequential time points;
each of the plurality of sequential time points corresponds to a particular memory component of the plurality of memory components; and
the PCC is further configured to direct output of a particular supply voltage to be supplied to each of the plurality of memory components at each of the plurality of sequential time points.

12. The memory sub-system of claim 7, wherein the monitoring unit is further configured to direct the PCC to:
reduce a first supply voltage supplied to a first output rail coupled to a first memory component responsive to a first determination that a first operation performed by the first memory component operates on a voltage that is less than the input voltage; and
increase a second supply voltage supplied to a second output rail coupled to a second memory component responsive to a second determination that a second operation performed by the second memory component operates on a voltage that is greater than the input voltage.

13. The memory sub-system of claim 7, wherein:
the CVD is further configured to output a voltage magnitude that is modified, relative to the input voltage, to correspond to the particular supply voltage; and
the CVD does not include a regulator component, in addition to the plurality of capacitors, configured to contribute to output of the voltage magnitude corresponding to the particular supply voltage.

14. The memory sub-system of claim 7, wherein the CVD is further configured to output a voltage magnitude, reduced relative to the input voltage, to a separate regulator configured to further reduce the reduced voltage to correspond to the particular supply voltage of the particular memory component.

15. The memory sub-system of claim 7, wherein the monitoring unit receives input from the plurality of memory components to enable determination of the particular supply voltage to be supplied to each of the plurality of memory components.

16. The memory sub-system of claim 7, wherein:
a first memory component of the plurality of memory components is a power management integrated circuit (PMIC) configured to operate within a first range of supply voltages;
a second memory component of the plurality of memory components is an array of memory cells configured to operate within a second range of supply voltages; and voltages within the second range of supply voltages have magnitudes less than voltages within the first range of supply voltages.

17. A method, comprising:
receiving an input voltage at a capacitive voltage divider (CVD) on a memory sub-system, wherein the CVD is coupled to a plurality of memory components, and wherein the input voltage is higher than uppermost supply voltages at which each of the memory components is configured to operate;
monitoring a status of use of the plurality of memory components;
responsive to the status of use of the memory components, the CVD selecting between a plurality of connections of a plurality of capacitors of the CVD to reduce the input voltage; and
selectably providing, by the CVD, reduced input voltages as a plurality of supply voltages corresponding to the plurality of memory components being monitored, wherein the plurality of supply voltages are not higher than the uppermost supply voltages at which each of the corresponding plurality of memory components is configured to operate.

18. The method of claim 17, comprising the CVD being configured for:
receiving the input voltage as a single voltage;
reducing the single voltage; and
outputting a plurality of reduced voltages to a corresponding plurality of output rails.

19. The method of claim 17, further comprising providing, by the CVD, a plurality of magnitudes of the supply voltages, wherein each of the plurality of magnitudes is selected to enable a use of a particular memory component of the plurality of memory components being monitored.

20. The method of claim 17, further comprising:
utilizing a switch of the CVD to output a supply voltage to an output rail coupled to the CVD and connected to a particular memory component, wherein the switch is configured to selectably:
couple to a first output rail;
output a first supply voltage from a first plurality of connected capacitors of the CVD to a first memory component via a coupled first output rail;
decouple the coupled first output rail;
couple to a second output rail; and
output a second supply voltage from a second plurality of connected capacitors of the CVD to a second memory component via a coupled second output rail.

* * * * *